(12) United States Patent
Pham et al.

(10) Patent No.: US 6,949,455 B2
(45) Date of Patent: Sep. 27, 2005

(54) METHOD FOR FORMING A SEMICONDUCTOR DEVICE STRUCTURE A SEMICONDUCTOR LAYER

(75) Inventors: Daniel Thanh-Khac Pham, Austin, TX (US); Bich-Yen Nguyen, Austin, TX (US); James K. Schaeffer, Austin, TX (US); Melissa O. Zavala, Pflugerville, TX (US); Sherry G. Straub, Pflugerville, TX (US); Kimberly G. Reid, Austin, TX (US); Marc Rossow, Austin, TX (US); James P. Geren, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 146 days.

(21) Appl. No.: 10/677,070

(22) Filed: Oct. 1, 2003

(65) Prior Publication Data

US 2004/0063285 A1 Apr. 1, 2004

Related U.S. Application Data

(62) Division of application No. 10/206,475, filed on Jul. 26, 2002, now Pat. No. 6,689,676.

(51) Int. Cl.$^7$ ............................................ H01L 21/3205
(52) U.S. Cl. ...................... 438/587; 438/592; 438/583; 438/275; 438/218; 438/519
(58) Field of Search ................................. 438/587, 592, 438/583, 275, 218, 510–569

(56) References Cited

U.S. PATENT DOCUMENTS

| 5,236,852 A | * | 8/1993 | Cherniawski et al. ....... 438/297 |
| 6,204,103 B1 | | 3/2001 | Bai et al. |
| 6,261,978 B1 | | 7/2001 | Chen et al. |
| 6,265,258 B1 | | 7/2001 | Liang et al. |
| 6,365,450 B1 | * | 4/2002 | Kim ........................... 438/216 |
| 2002/0137287 A1 | * | 9/2002 | Takebuchi .................. 438/258 |

OTHER PUBLICATIONS

Tavel et al., "Totally Silicided (CoSi$_2$) Polysilicon: A Novel Approach to Very Low–Resistive Gate (–252/ ) Without Metal CMP Nor Etching," IEEE, 2001, 4 pgs.

* cited by examiner

*Primary Examiner*—David Zarneke
*Assistant Examiner*—Victor V. Yevsikov
(74) *Attorney, Agent, or Firm*—James L. Clingan, Jr.; Robert L. King

(57) ABSTRACT

A method for providing gates of transistors with at least two different work functions utilizes a silicidation of two different metals at different times, silicidation for one gate and polysilicon for the other, or silicidation using a single metal with two differently doped silicon structures. Thus the problem associated with performing silicidation of two different metals at the same time is avoided. If the two metals have significantly different silicidation temperatures, the one with the lower temperature silicidation will likely have significantly degraded performance as a result of having to also experience the higher temperature required to achieve silicidation with the other metal.

5 Claims, 9 Drawing Sheets

METHOD FOR FORMING A SEMICONDUCTOR DEVICE STRUCTURE A SEMICONDUCTOR LAYER

This is a division of application No. 10/206,475, filed Jul. 26, 2002, now U.S Pat. No. 6,689,676.

FIELD OF THE INVENTION

This invention is related to a method for making integrated circuits and more particularly to integrated circuits having dual work functions for the control gate electrode.

RELATED ART

In the manufacture of integrated circuits the progress is continuing in the area of faster speed and smaller individual transistor devices. As this continues to occur the commonly used gate (control electrode) of polysilicon is beginning to reach technology levels in which it is inadequate. Its ability to achieve the desired work function for both N and P-channel devices is becoming more and more difficult to achieve while retaining the desired level of conductivity.

One of the difficulties in achieving dual work functions in transistor devices is that the primary technique for achieving this is using two different metal types. The result is very difficult manufacturing processes because the patterned metal etches of metal are difficult to achieve in many cases and also the typical technique requires completely removing one of the metals over the gate oxide that is used for one of the transistor types. For example, if a first deposited metal is going to be used for N-channel transistors, in the locations where there are to be P-channel transistors this first-deposited metal must be completely removed. This is required because the metal that is closest to the channel is what controls the work function. Thus the metal for the N-channels in this case must be completely removed over the P-channel transistors. The result is the etchant that is used to remove this metal comes in contact with the underlying gate dielectric. The gate dielectric then for the P-channel transistors is damaged and may cause reliability issues for transistor gates that are formed over it. Removing the gate damaged gate dielectric and reforming another is generally not practical because of the high heat required to form gate dielectrics of adequate quality for manufacturing. Thus gate dielectrics have become a major issue for this.

Another approach may be to utilize a gate dielectric material that can withstand the etchant materials quite well. In practicality, however, this is very difficult to find. It is very difficult to have a situation in which a gate dielectric receives a metal etchant and is not damaged at all. Further, many metals are fairly difficult to remove, although it is much easier to remove a blanket or wide area of metal than it is to perform an etch requiring a precise edge of a metal such as is required for forming gates.

Thus, there is a need for a way to achieve etching of gate materials that provide the needed dual work functions without requiring difficult patterned metal etches and without causing damage to the gate dielectrics.

The drawings depict embodiments of the invention but are not drawn to any particular scale.

DETAILED DESCRIPTION OF THE DRAWINGS

A dual work function is achieved without requiring a patterned metal etch by forming a first silicide over one well type by reacting deposited silicon with an overlying metal. The overlying metal is separated from the silicon over the other well type by a hard mask that prevents silicide formation with the silicon over the other well type. Thus there is silicide over one well type and silicon on the other well type. Thus, the silicon over the other well type can either itself be used to determine the work function of transistors formed in the other well type or be reacted with an alternative metal. In either case, there are established two different work functions. If the silicon option is chosen, it should preferably be for P-type transistors. This is better understood with reference to the drawings and the following description.

Figure 1:
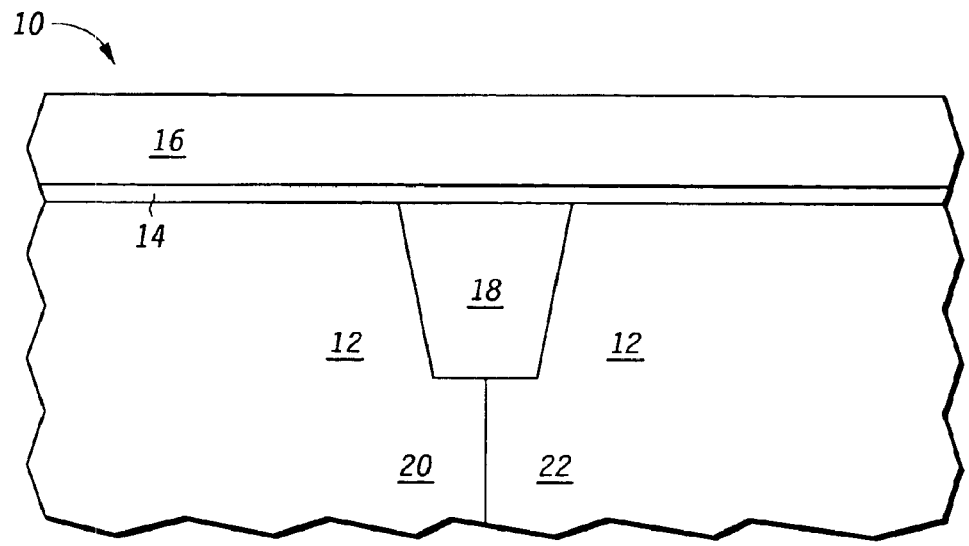
FIGS. 1–11 are cross sections of an integrated circuit showing sequential stages of processing according to one embodiment of the invention.

Shown in FIG. 1 is a semiconductor device structure 10 comprising a substrate 12, a dielectric layer 14 suitable for being a gate dielectric, a silicon layer 16 over dielectric layer 14, an isolation region 18, an N-well 20, and a P-well 22 on opposite sides of isolation region 18. Silicon layer 16 is preferably amorphous silicon. As an alternative it could be a combination of silicon and germanium. In any event, however, it is a silicon-containing layer and preferably with silicon being the dominant element. Dielectric layer 14 can be a metal oxide or silicon oxide or another material suitable as a gate dielectric. Substrate 12 in this embodiment is silicon and may be semiconductor on insulator (SOI) type substrate. Gate dielectric 14 is preferably 10 to 100 Angstroms. High K materials can be thicker than those that are not high K. Silicon layer 16 is preferably 50 to 500 Angstroms. The silicon layer 16 may also be doped or left undoped. Boron doping is preferred for P-type transistors. Phosphorus or arsenic are preferred for N channel transistors. Nitrogen is also a possible dopant of silicon that can be used to affect the work function that results from the silicidation of the nitrogen-doped silicon.

Figure 2:
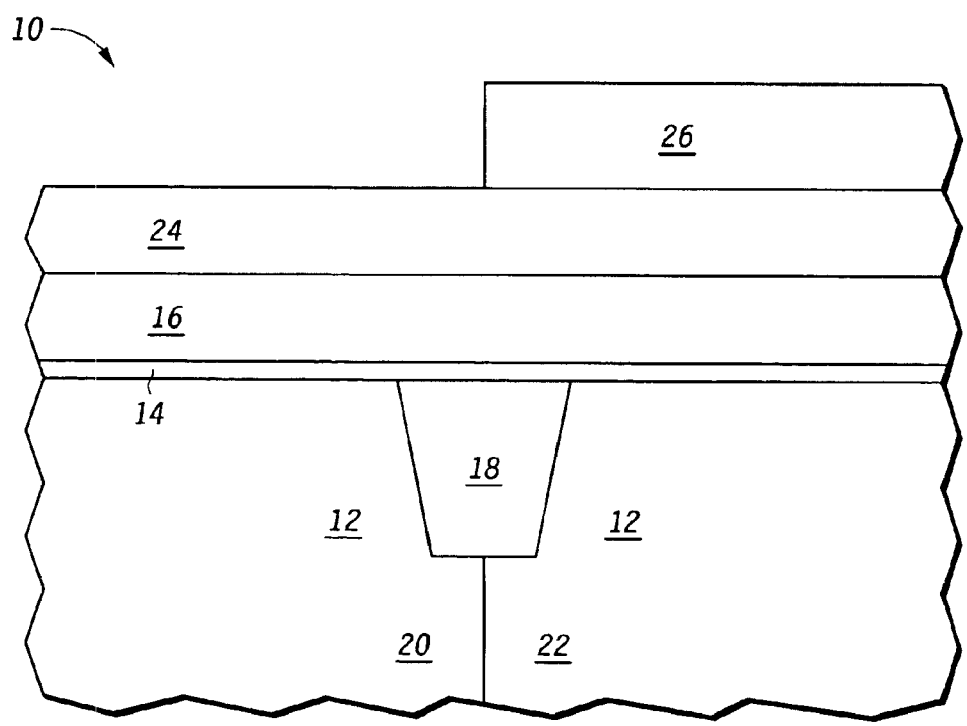
Figure 3:
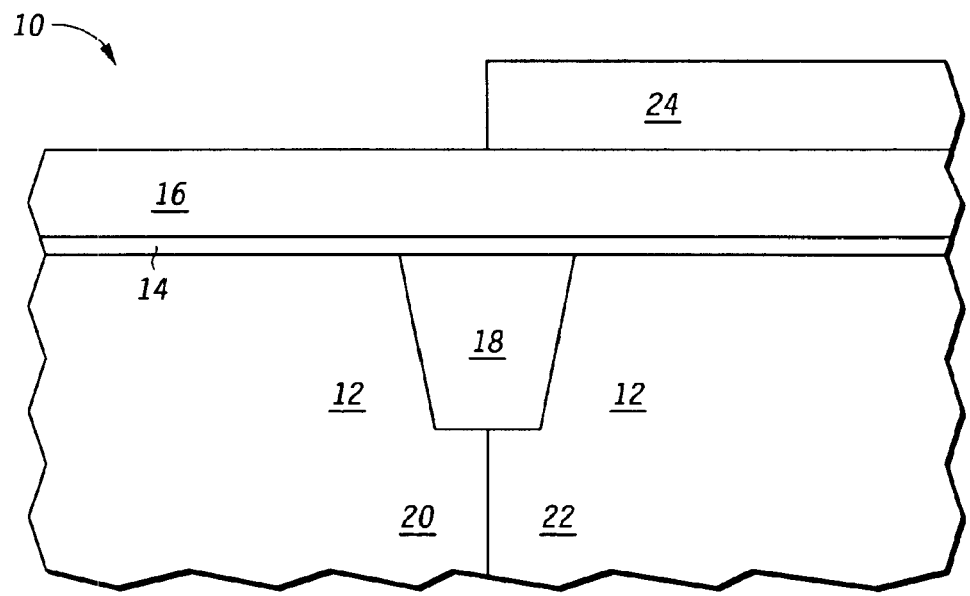

Shown in FIG. 2 is a semiconductor device 10 after a mask layer 24 has been deposited on silicon layer 16 and a photoresist mask 26 has been deposited and patterned to be open over N-well 20. Photoresist mask 26 is used as a mask to etch in the etch of mask layer 24 and photoresist mask 26 is then removed with the results shown in FIG. 3. With mask layer 24 being patterned it is open over N-well 20. The exposed portion of silicon layer 16 may be doped at this point so that only the portion of silicon layer 16 that is exposed is doped, or in the event that silicon layer has already been doped, the exposed portion of silicon layer 16 may then be doped to a different doping than that portion of silicon layer 16 that is over well 22. Mask layer 24 is preferably silicon oxide or silicon nitride and may be combination of both. The thickness may be a quite a wide range in thickness, for example 50 to 2000 Angstroms.

Figure 4:
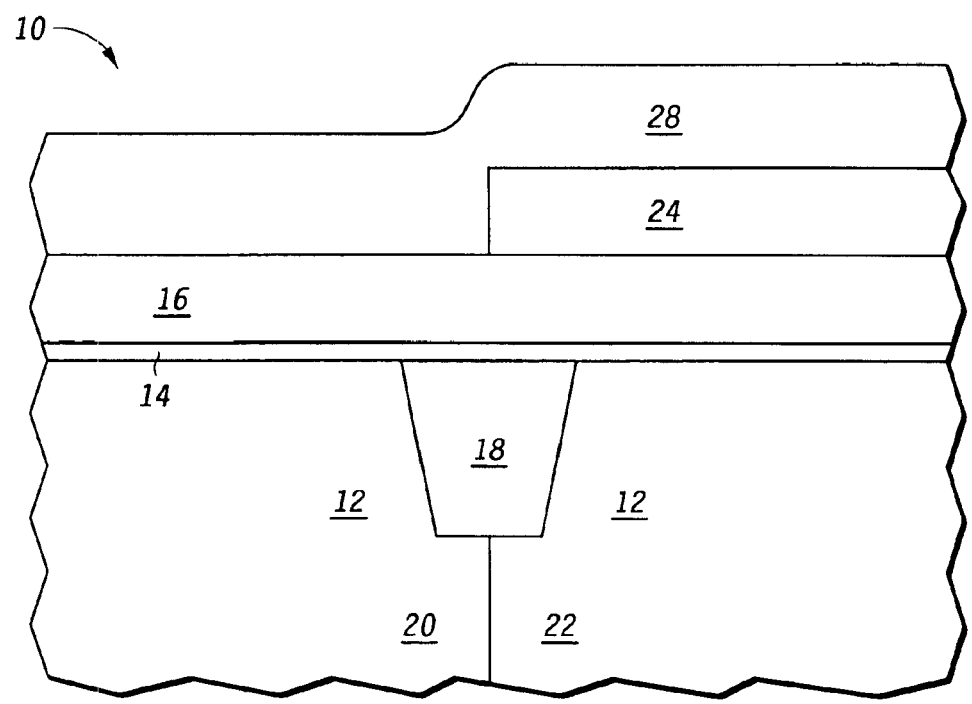
Figure 5:
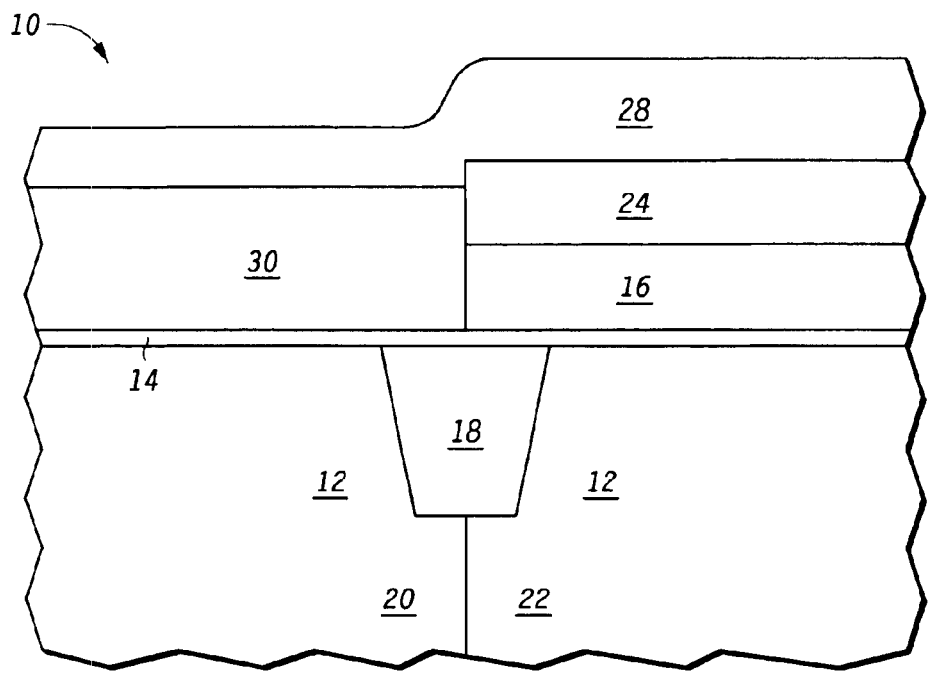

As shown in FIG. 4, subsequently a metal layer 28 is deposited over silicon layer 16 and mask layer 24. Thus metal layer 28 is in direct contact with silicon layer 16 in the area over N-well 20 but not in contact with silicon layer 16 in the area over P-well 22. A heating step, also called annealing, is then performed which causes the portion of silicon layer 16 in direct contact with metal layer 28 to form a silicide 30 as shown in FIG. 5. Subsequently metal layer 28 is then removed with the result shown in FIG. 6. This removal of metal layer 28 is achieved relatively easily because this removal of metal layer 28 does not involve patterning. Thus a simple wet etch can be used that is very effective in completely removing metal layer 28. The result is a silicide layer over N-well 20 but not a silicide layer over P-well 22. Silicide layer 30 is thus in a position to become a gate (control electrode) for N-well 20 to form a P-channel transistor. The work function for such a P-channel transistor is thus based upon the type of silicide and by the doping, if any, of the amorphous silicon layer 16 that produced silicide layer 30. For a P-type transistor which would be formed in an N-well such as N-well 20, effective metals are titanium, tantalum and tungsten for the silicides. Thus silicide 30 is preferably titanium silicide, tantalum silicide or tungsten silicide. The threshold voltage of the transistors that are ultimately formed is affected by the work function but not completely controlled by it. The particular process that is chosen also plays a role, especially as the process relates to channel doping. Thus, the particular choice among preferred choices titanium, tantalum, and tungsten for the silicide for P-type transistors will likely be influenced by the process utilized.

Figure 6:
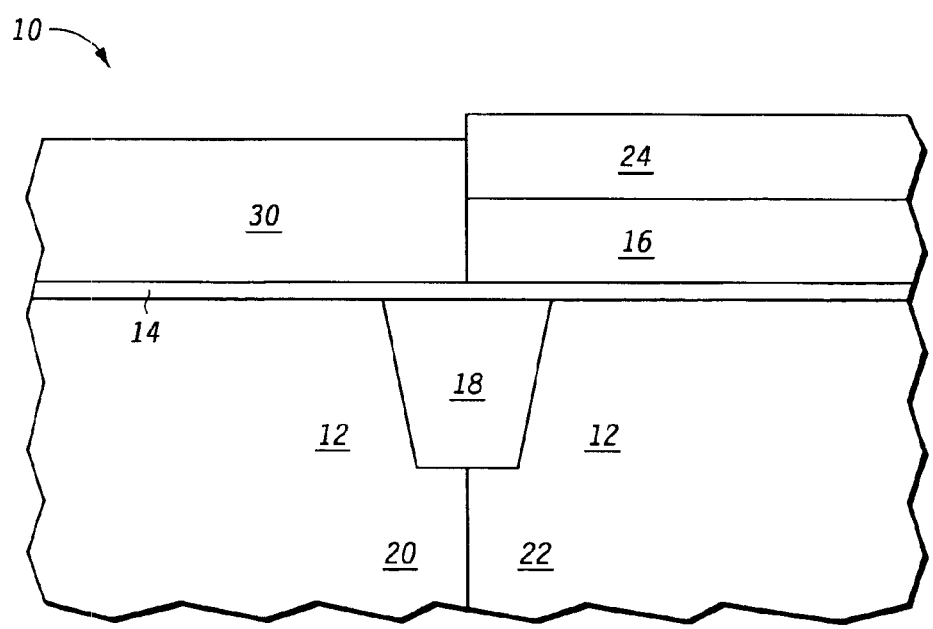
Figure 7:
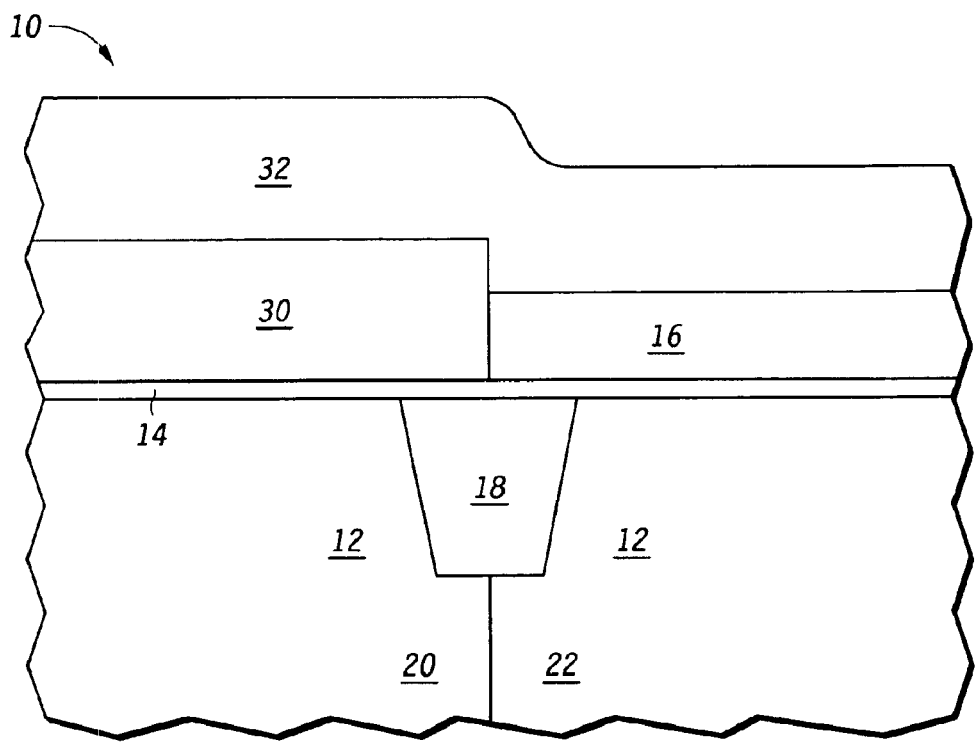
Figure 8:
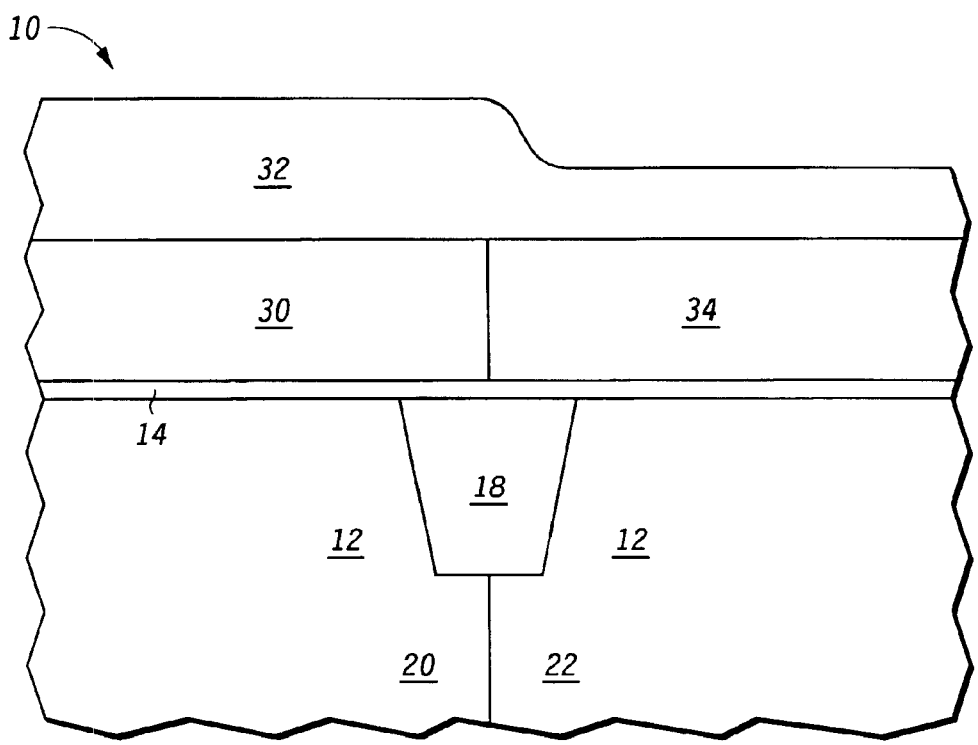

As shown in FIG. 7 and subsequent to the formation of silicide 30 as shown in FIG. 6, mask layer 24 is removed and a second metal layer is deposited over silicide 30 and silicon layer 16. Another heating step is performed which causes formation of a metal silicide layer 34 over P-well 22. In this case silicide layer 34 determines the work function for the N-type transistors formed in P-well 22. Preferably metal layer 32 is molybdenum, which results in a molybdenum silicide layer. The molybdenum layer 32 does not form additional silicides because it does no chemically react with silicide layer 30 because it is already a fully reacted silicide. Thus silicide 30 is unchanged based upon the formation of silicide 34 even though metal layer 32 is in direct contact with, silicide layer 30 as shown in FIG. 8.

Figure 9:
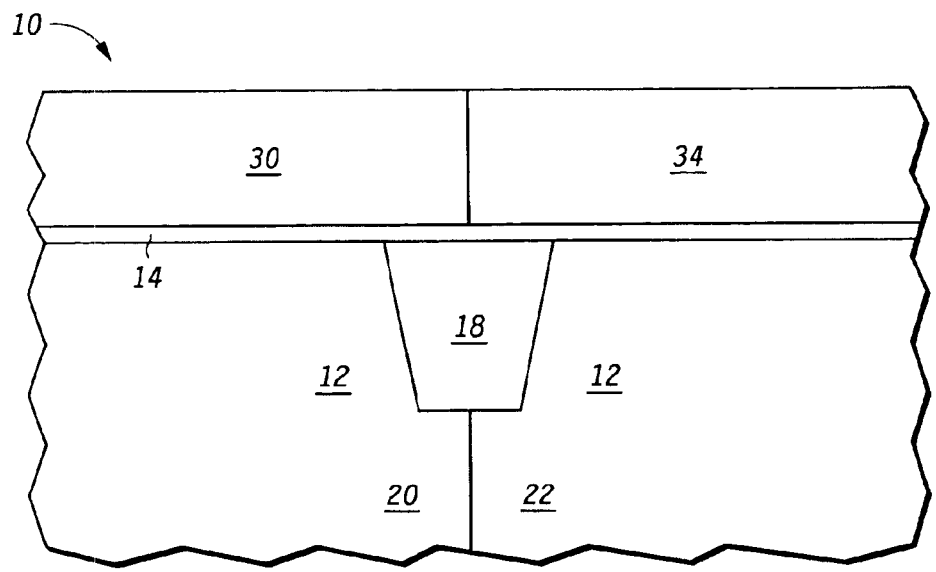
Figure 10:
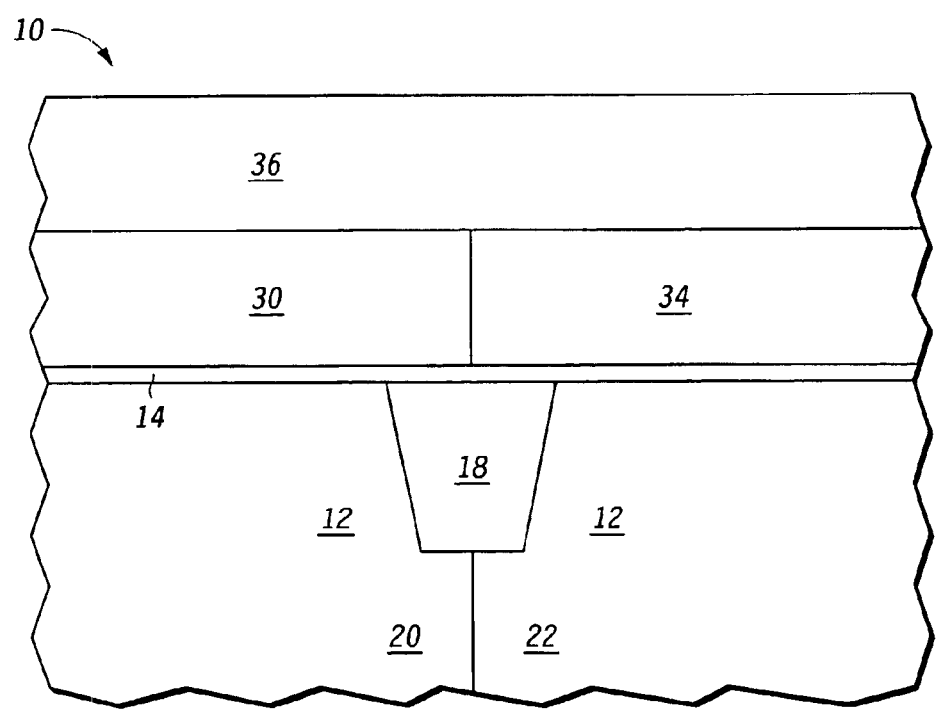

Shown in FIG. 9 is semiconductor device structure 10 after removal of metal layer 32. An in situ doped polysilicon layer 36 is deposited over silicide layer 30 and 34 as shown in FIG. 10. Subsequently a P-type transistor 38 is formed over N-well 20 and an N-type transistor 40 is formed over P-well 22. This is achieved by a patterned etch of the two silicide layers 30 and 34 and of the in situ doped polysilicon layer 36. The completed P-type transistor 38 has sidewall spacers 42 and 44 and source/drains 50 and 52. Similarly, N-type transistor 40 has sidewall spacers 46 and 48 and source/drains 54 and 56. The formation of transistors 38 and 48 is achieved from the device structure shown in FIG. 10 by techniques known to one of ordinary skill in the art.

Figure 11:
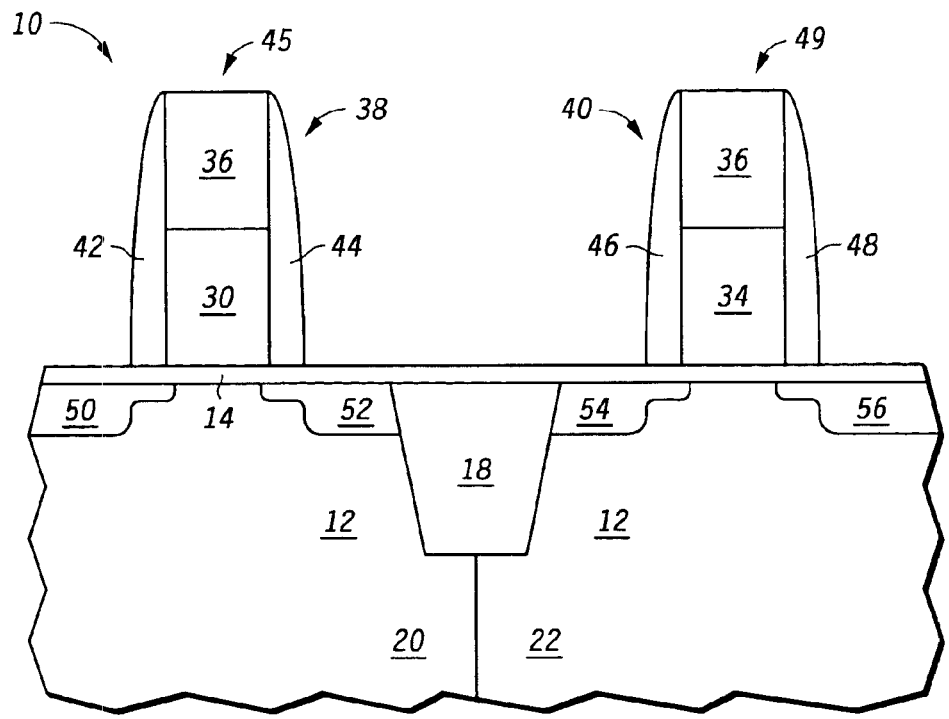

In situ doped polysilicon layer 36 is useful in providing the necessary conductivity for the gate structure that is shown as gate stack 45 in FIG. 11. Gate stack 45 comprises in situ doped polysilicon layer 36 and silicide layer 30 as shown in FIG. 11. Similarly gate stack 49 of transistor 40 comprises in situ doped polysilicon layer 36 and silicide layer 34. Silicide layer 30 is described as preferably titanium, tantalum or tungsten for it being a gate for a P-channel transistor. Alternatives are platinum or nickel. There may be other alternative as well. Further, there may be a combination of any of these materials of titanium, tantalum, tungsten, platinum and nickel to achieve the desired work function characteristics in a predetermined ratio. This combination of metals may be either mixed together as an alloy or in layers of different metals. A top layer of a particular metal may be useful in protecting against the formation of an unwanted material that would occur on the underlying layer in the absence of the overlying protective layer. Similarly, for silicide layer 34 molybdenum is preferred but an alternative material is zirconium and hafnium and there may be other alternatives as well.

In this particular method described for FIGS. 1–10, the silicide 30 over N-channel 20 was performed first because the processes involved were titanium, tantalum and tungsten which require relatively high temperature processes which are preferably performed prior to lower temperature processes. In this case the molybdenum silicidation occurs typically at around 400 degrees Celsius whereas the titanium, tantalum and tungsten salicidations occur typically in excess of 700 degrees Celsius. By having the two silicidations occur at different times, it is feasible to use metals with diverse silicidation temperatures. If the silicide with low temperature formation, such as molybdenum, experiences the much higher temperatures required for titanium, tantalum, and tungsten, it will develop agglomerations of the metal that result in a significant decrease in the conductivity of the silicide; a very undesirable result. Thus it can critically important to have the high temperature silicidation occur prior to the low temperature silicidation. In addition to having the two gates formed of different silicides, in other areas, the polysilicon is left the same for use as a floating gate. It is understood that in an actual semiconductor device, there would be many more that just two devices and some could be adapted for use as floating gate devices while still have regular P and N type devices with gates of differing work functions consistent with one or more of the embodiments described herein.

Figure 12:
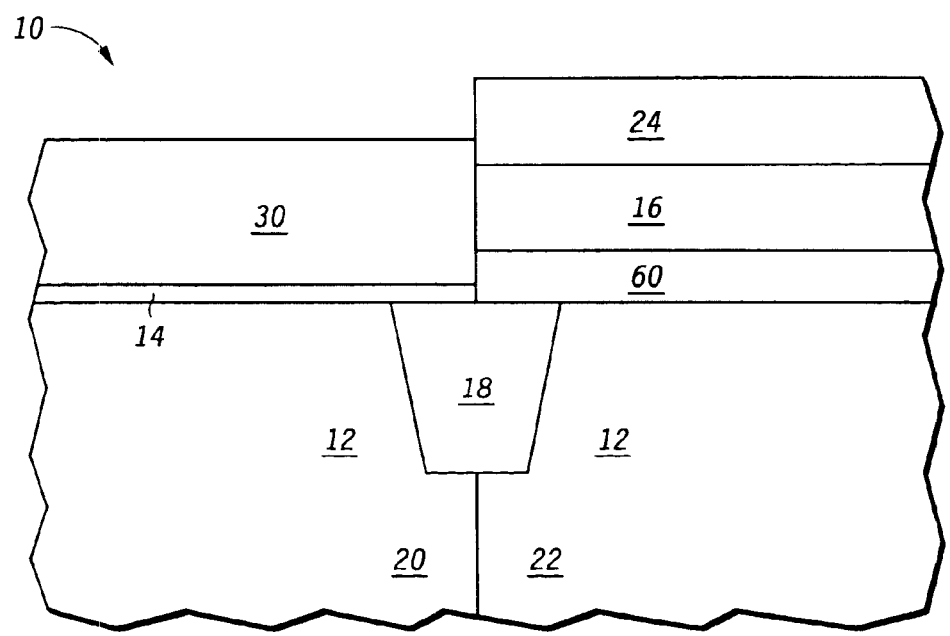
FIGS. 12–15 are cross sections of an integrated circuit showing sequential stages of processing according to an alternative embodiment of the invention.

Shown in FIG. 12 is the result of an alternative step following FIG. 6. A further difference is that FIG. 12 the well would preferably be a P-well instead of an N-well in which case silicide 30 would be molybdenum silicide. That is in FIGS. 12–15, well 20 is preferably a P-type well and well 22 is preferably an N-type well. In such alternative embodiment a heating step is performed while oxygen is applied from an oxygen rich environment. The oxygen penetrates mask layer 24 and polysilicon 16 to generate additional silicon oxide to form silicon oxide layer 60. Silicide layer 30 is relatively immune to passing a reactant, preferably oxygen, through to gate dielectric 14 under silicide layer 30. This is a way of forming an increased thickness in gate dielectric. Especially this is an effective technique for increasing the thickness of the gate dielectric when it is an oxide and is particularly useful for high voltage applications. There are numerous situations in which there is a benefit to having some transistors available that are capable of higher voltage operation than the vast majority of the transistors which are optimized for speed and other electrical characteristics. The process could continue after FIG. 12 as in FIGS. 7–11. in which case the wells 20 and 22 would be preferably N-type and P-type, respectively as is the preferred case for the embodiment shown in FIGS. 1–11.

Figure 13:
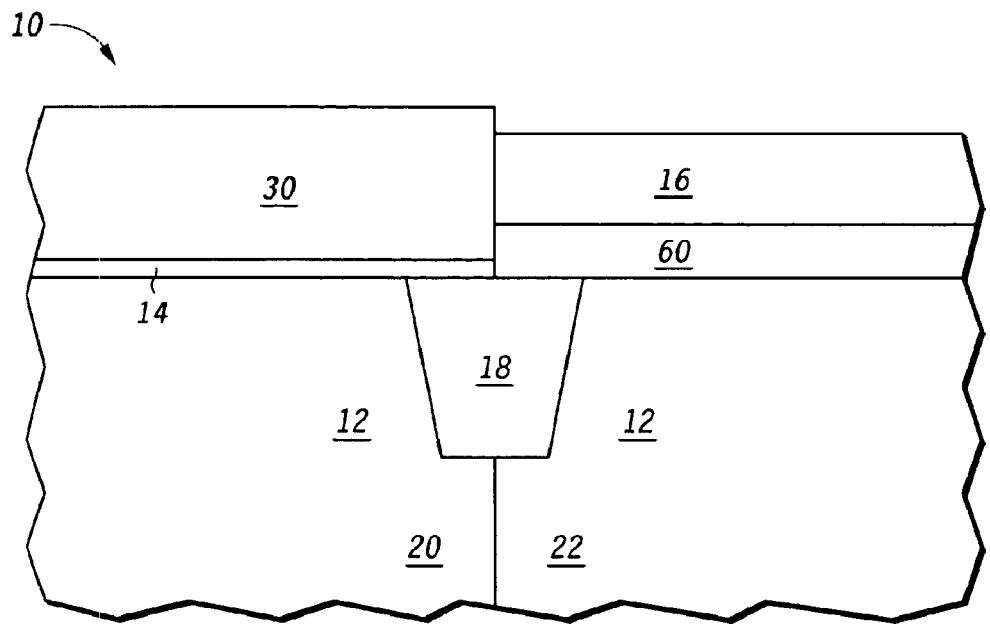
Figure 14:
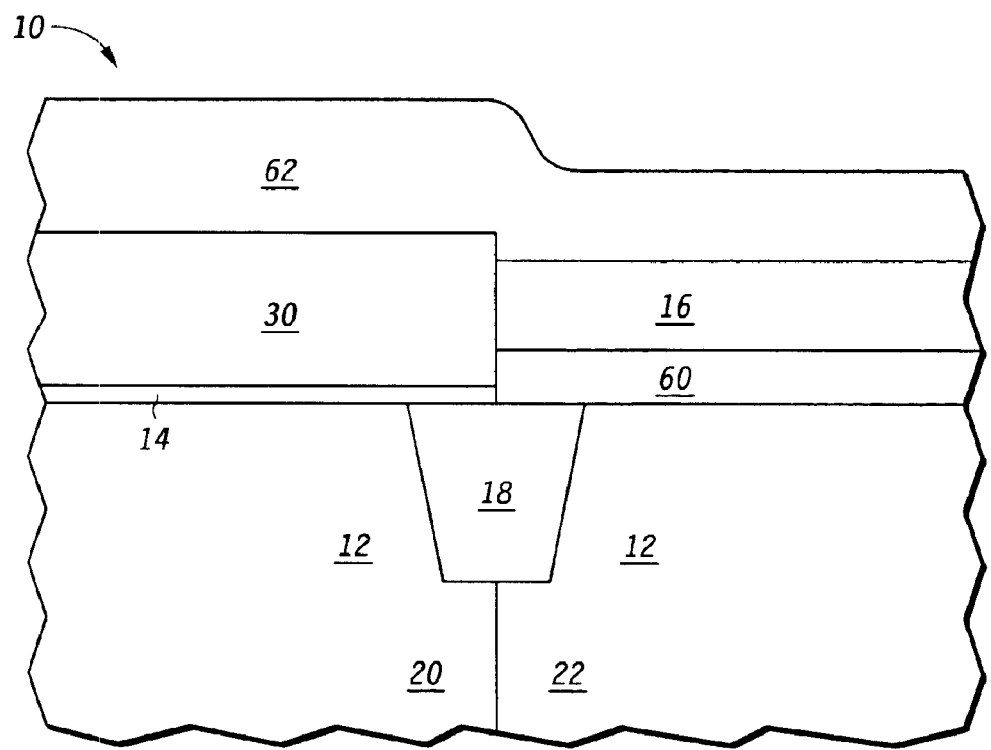
Figure 15:
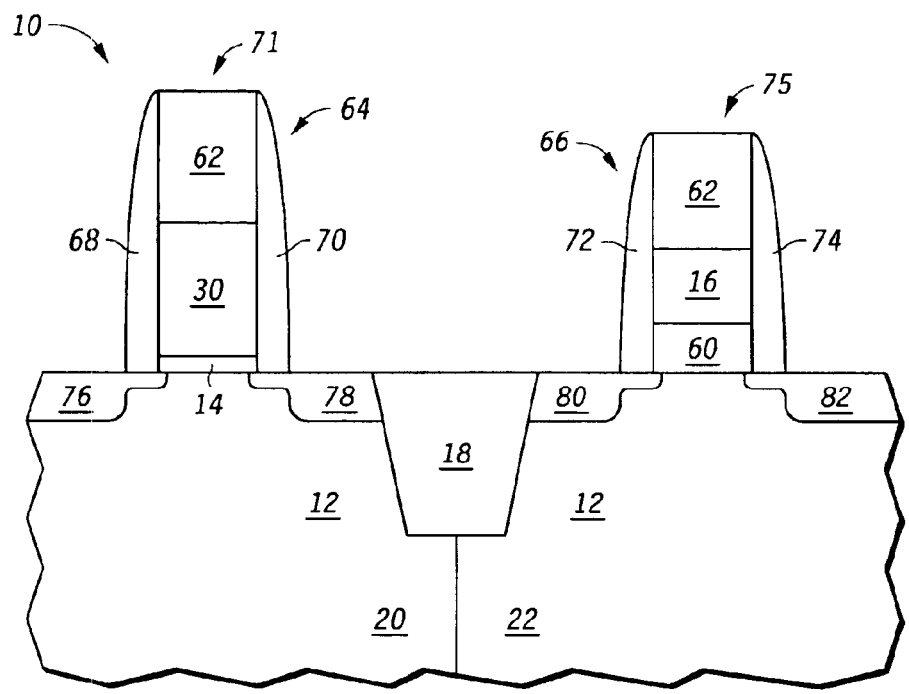

The embodiment shown in FIGS. 12–15 is for the case where a polysilicon gate is used to form a P-type transistor. Thus well 22 needs to be an N-well. The polysilicon can be effectively used as a P-type transistor because the work function for a P-type transistor can be achieved in polysilicon while maintaining excellent conductivity of the polysilicon. Thus it may be possible to achieve the desired work function characteristic and the desired conductivity using polysilicon for the P-type while using a silicide such as silicide 30 for the N-type. Mask layer 24 is removed with the result as shown in FIG. 13. An in situ doped polysilicon layer 62 is then formed over silicide layer 30 and silicon layer 16 as shown in FIG. 14. From the structure of semiconductor device 10 shown in FIG. 14 conventional techniques can be utilized to form transistors 64 and 66 as shown in FIG. 15. Transistor 64 is shown as having sidewall spacers 68 and 70, and source/drains 76 and 78. Transistor 66 is shown as having sidewall spacers 72 and 74, and source/drain regions 80 and 82. Thus transistor 66 would have a silicon layer 16 with an in situ doped polysilicon layer 62 over it to form a gate stack 75 of transistor 66. Similarly silicide 30 and in situ doped polysilicon layer 62 would form a gate stack 71 of transistor 64.

Figure 16:
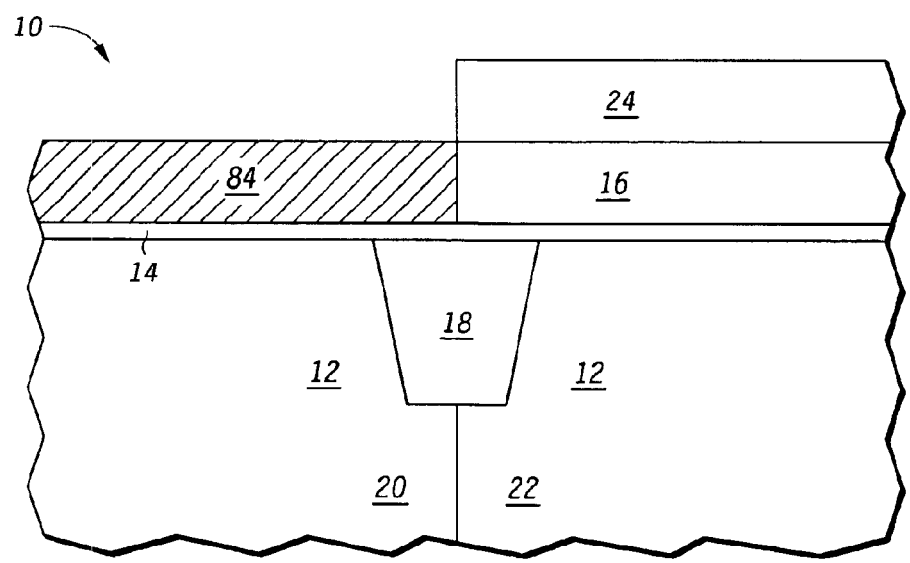
FIGS. 16–18 are cross sections of an integrated circuit showing sequential stages of processing according to another alternative embodiment of the invention.

Shown in FIG. 16 is the result of performing a doping step for the exposed portion of silicon layer 16 using mask layer 24 as a mask. This doped portion is shown in FIG. 16 as doped portion 84. This doping is preferably boron. Silicon layer 16 may already be doped with phosphorus or arsenic so that boron provides counterdoping. This can also be reversed by first blanket doping with phosphorus or arsenic and then counterdoping with boron as appropriate. Nitrogen is also a material that can be used as a dopant.

Figure 17:
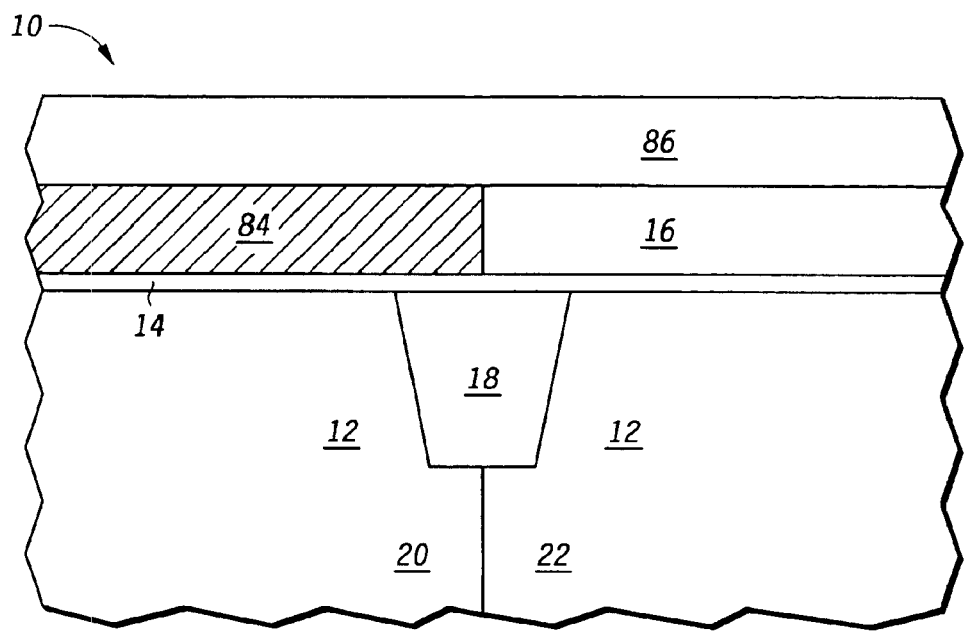
Figure 18:
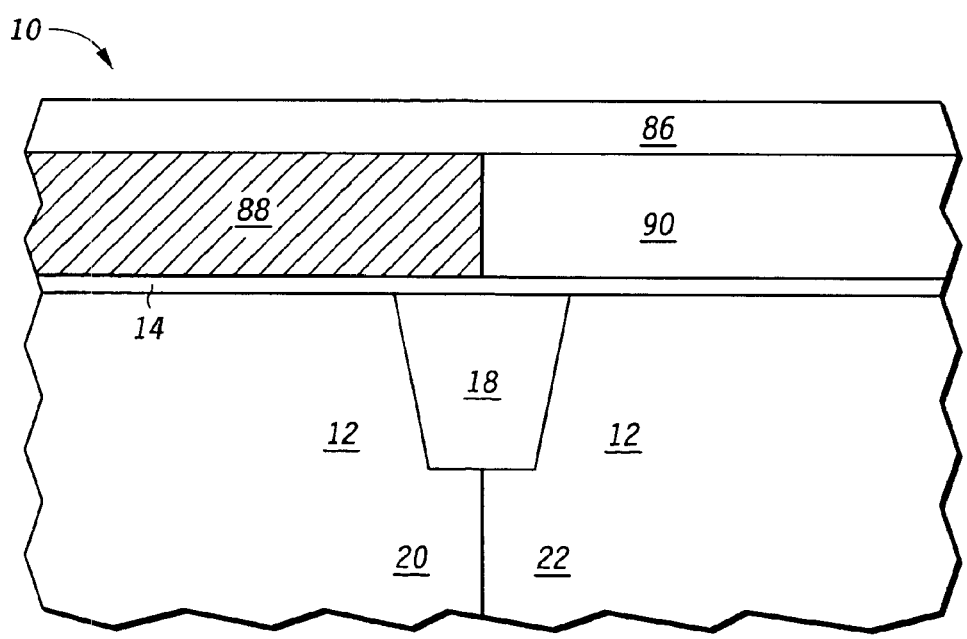

Shown in FIG. 17 is the result of removing mask layer 24 and depositing a layer of metal over doped portion 84 and remaining silicon layer 16. A heating step is provided to cause formation of silicide layer 88 from doped portion 84 and silicide layer 90 from silicon layer 16 that was over well 22 as shown in FIG. 18. The metal present in metal layer 86 is preferably titanium but other metals may work as well. The doping of silicon layer 16 is thus the basis for providing dual work functions using a single metal. The silicon is relatively easily doped by implanting or by diffusion. Doping a metal is generally not feasible. Implanting into a dense material like a metal is quite difficult, whereas the equipment for doping silicon by implanting is of course common in present semiconductor manufacturing. So in the case of the structure shown in FIG. 18, silicides of differing work functions are achieved by a single metal being deposited and thus a single heating step to form silicides. By using the same metal for both silicides, there is the benefit of no temperature differential for the formation of the two suicides. That is the silicidation temperature is dictated by the metal not by the doping of the silicon. Another advantage of this single metal embodiment is that there is actually no need for forming hard mask 24. Photoresist is sufficient for masking an implant.

What is claimed is:

1. A method for forming a semiconductor device structure in a semiconductor layer, comprising:

forming a first region and a second region of opposite conductivity type in the semiconductor layer, the first region and the second region being electrically isolated by an isolation region;

forming a control electrode dielectric overlying the first region and the second region;

forming a silicon-containing layer overlying and in contact with the control electrode dielectric;

doping a first portion of the silicon-containing layer with a first predetermined dopant material;

doping a second portion of the silicon-containing layer with a second predetermined dopant material;

depositing a metal layer overlying the silicon-containing layer;

annealing the semiconductor device to form a first control electrode silicide in the first portion of the silicon-containing layer and to form a second control electrode silicide in the second portion of the silicon-containing layer;

forming a first control electrode from the first control electrode silicide and forming a second control electrode from the second control electrode silicide; and completing formation of a first transistor using the first control electrode and completing formation of a second transistor using the second control electrode.

2. The method of claim 1 wherein the depositing of the metal layer further comprises:

selectively depositing a first metal layer overlying the first portion of the silicon-containing layer;

forming a first silicide control electrode by annealing the semiconductor device at a first temperature;

selectively depositing a second metal layer overlying the second portion of the silicon-containing layer; and forming a second silicide control electrode by annealing the semiconductor device at a second temperature that is substantially lower than the first temperature;

wherein the first silicide control electrode has a different work function than the second silicide control electrode.

3. The method of claim 1 further comprising:

depositing the metal layer as a single metal layer overlying both the first portion and the second portion of the silicon-containing layer.

4. The method of claim 1 further comprising:

exposing the semiconductor device structure in an oxygen rich environment prior to forming the second control electrode silicide, the oxygen rich environment modifying a thickness of a portion of the control electrode dielectric that is not underlying the first control electrode silicide.

5. The method of claim 1 further comprising:

depositing in-situ doped polysilicon overlying the first control electrode silicide and the second control electrode silicide for use as part of the first control electrode and the second control electrode.

\* \* \* \* \*